US008927066B2

(12) United States Patent
Ye et al.

(10) Patent No.: US 8,927,066 B2
(45) Date of Patent: Jan. 6, 2015

(54) METHOD AND APPARATUS FOR GAS DELIVERY

(75) Inventors: Zhiyuan Ye, San Jose, CA (US); Yihwan Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 922 days.

(21) Appl. No.: 13/097,831

(22) Filed: Apr. 29, 2011

(65) Prior Publication Data

US 2012/0273052 A1 Nov. 1, 2012

(51) Int. Cl.
*C23C 16/448* (2006.01)
*C23C 16/455* (2006.01)

(52) U.S. Cl.
CPC ....... *C23C 16/4481* (2013.01); *C23C 16/45557* (2013.01); *C23C 16/45561* (2013.01)
USPC ................ 427/444; 73/863.11; 137/1; 137/4; 156/1; 427/255.23; 427/561; 436/55; 438/5

(58) Field of Classification Search
CPC ..................... C23C 16/4481; C23C 16/45557; C23C 16/45561
USPC .............. 73/863–863.01, 863.11; 137/1, 3–4, 137/861; 156/1; 427/255.23, 401, 444, 561, 427/FOR. 102; 436/55, 181; 438/5, 503, 438/507, 935, FOR. 141
See application file for complete search history.

(56) References Cited

U.S. PATENT DOCUMENTS

| | | | | |
|---|---|---|---|---|
| 3,701,682 A | * | 10/1972 | Gartman et al. | 438/935 X |
| 3,829,382 A | * | 8/1974 | Tucker | 438/935 X |
| 5,980,608 A | | 11/1999 | Dietz et al. | |
| 6,033,479 A | | 3/2000 | Ikeda | |
| 6,136,725 A | * | 10/2000 | Loan et al. | C23C 16/45561 |
| 6,244,575 B1 | * | 6/2001 | Vaartstra et al. | 261/141 |
| 6,432,205 B1 | | 8/2002 | Lee et al. | |
| 6,548,112 B1 | * | 4/2003 | Hillman et al. | 427/255.23 X |
| 6,868,869 B2 | | 3/2005 | Olander | |

(Continued)

FOREIGN PATENT DOCUMENTS

| | | | | |
|---|---|---|---|---|
| CN | 102021531 A | * | 4/2011 | ............ C23C 16/455 |
| EP | 692553 A1 | * | 1/1996 | ............ C23C 16/448 |
| JP | 05234917 A | * | 9/1993 | |
| WO | WO 2004027112 A2 | * | 4/2004 | ............ C23C 16/448 |
| WO | WO 2006065426 A2 | * | 6/2006 | ............ C23C 16/455 |
| WO | WO 2006104783 A1 | * | 10/2006 | ............ C23C 16/448 |
| WO | WO 2006104794 A1 | * | 10/2006 | ............ C23C 16/448 |

OTHER PUBLICATIONS

International Search Report and Written Opinion mailed Nov. 16, 2012 for PCT Application No. PCT/US2012/035465.

*Primary Examiner* — Thomas P Noland
(74) *Attorney, Agent, or Firm* — Moser Taboada; Alan Taboada

(57) ABSTRACT

Methods and apparatus for gas delivery are disclosed herein. In some embodiments, a gas delivery system includes an ampoule for storing a precursor in solid or liquid form, a first conduit coupled to the ampoule and having a first end coupled to a first gas source to draw a vapor of the precursor from the ampoule into the first conduit, a second conduit coupled to the first conduit at a first junction located downstream of the ampoule and having a first end coupled to a second gas source and a second end coupled to a process chamber, and a heat source configured to heat the ampoule and at least a first portion of the first conduit from the ampoule to the second conduit and to heat only a second portion of the second conduit, wherein the second portion of the second conduit includes the first junction.

16 Claims, 3 Drawing Sheets

(56) References Cited

U.S. PATENT DOCUMENTS

| | | |
|---|---|---|
| 7,033,938 B2 * | 4/2006 | Bour et al. ............... 438/507 X |
| 7,279,432 B2 * | 10/2007 | Xi et al. ..................... 438/763 |
| 7,413,767 B2 * | 8/2008 | Bauch et al. ......... 427/255.23 X |
| 8,703,590 B2 * | 4/2014 | Ito et al. ..................... 438/507 |
| 8,734,903 B2 * | 5/2014 | Nelson ............... 427/255.23 X |
| 2001/0035127 A1 * | 11/2001 | Metzner et al. ..... C23C 16/4481 |
| 2005/0257735 A1 | 11/2005 | Guenther |
| 2009/0205538 A1 * | 8/2009 | Thompson et al. ...... 106/287.18 |
| 2010/0305884 A1 * | 12/2010 | Yudovsky et al. .. C23C 16/4481 |

* cited by examiner

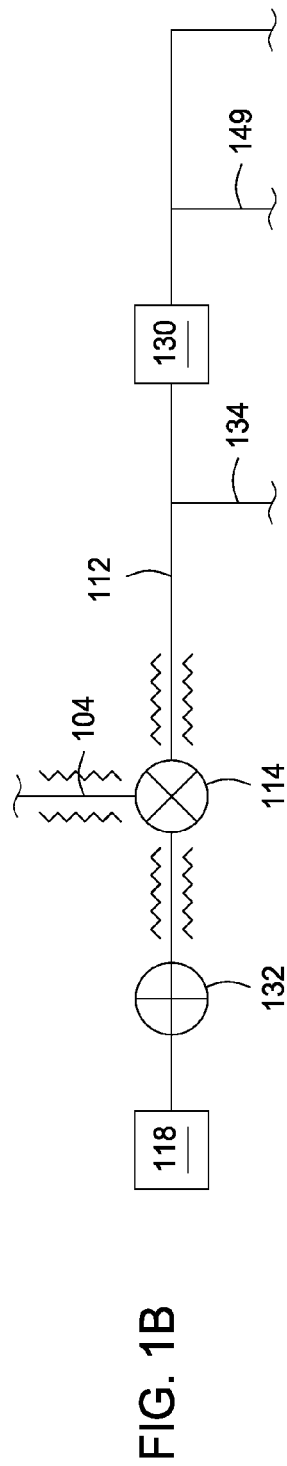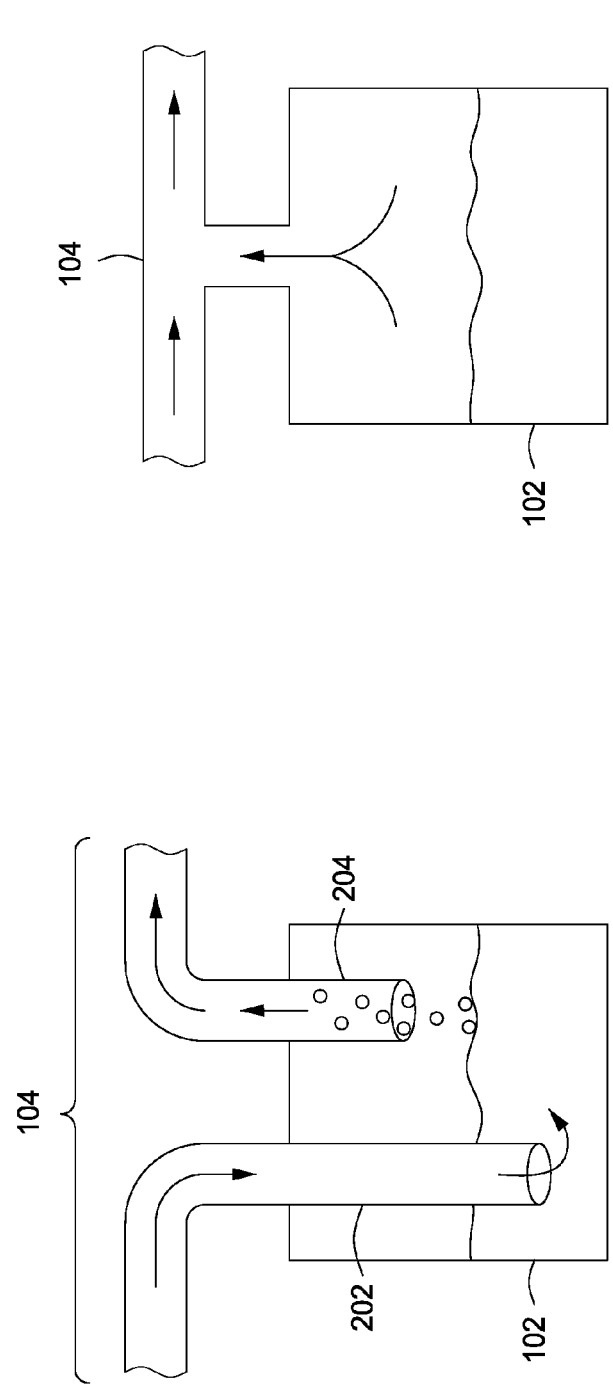

METHOD AND APPARATUS FOR GAS DELIVERY

FIELD

Embodiments of the present invention generally relate to methods and apparatus for gas delivery, and more specifically to the delivery of a gas having a low vapor pressure.

BACKGROUND

The remote delivery of low vapor pressure precursors in solid or liquid form to a process chamber requires heating of an ampoule that holds the low vapor pressure precursor and a long gas line that carries the vaporized low vapor pressure precursor to a process chamber, for example, to expose a substrate to the precursor. However, the heating/isolating of the long gas line is apt to fail and is often difficult to maintain. Moreover, the inventors have observed that remote delivery of the precursor may also have a slow response believed to be due to the line volume and the limited flow rate of the precursor from the ampoule. The inventors have further observed that such heated delivery systems also require an upstream mass flow controller (MFC) to control the gas flow rate in order to avoid any condensation problems inside the MFC. However, positioning the MFC upstream of the ampoule makes the ampoule susceptible to downstream pressure fluctuation, which impacts the delivery accuracy of the precursor.

Thus, the inventors have provided herein improved methods and apparatus for gas delivery of low vapor pressure precursors.

SUMMARY

Methods and apparatus for gas delivery are disclosed herein. In some embodiments, a gas delivery system includes an ampoule for storing a precursor in solid or liquid form, a first conduit coupled to the ampoule and having a first end coupled to a first gas source to draw a vapor of the precursor from the ampoule into the first conduit, a second conduit coupled to the first conduit at a first junction located downstream of the ampoule and having a first end coupled to a second gas source and a second end coupled to a process chamber, and a heat source configured to heat the ampoule and at least a first portion of the first conduit from the ampoule to the second conduit and to heat only a second portion of the second conduit, wherein the second portion of the second conduit includes the first junction.

In some embodiments, a method of delivering a precursor to a process chamber includes vaporizing a precursor while flowing a first gas to form a concentrated precursor gas mixture in a first heated volume, mixing the concentrated precursor gas mixture with a second gas in a second heated volume to form a diluted precursor gas mixture, wherein the partial pressure of the precursor in the diluted precursor gas mixture is less than the vapor pressure of the precursor at about 25 degrees Celsius, and flowing the diluted precursor gas mixture to a process chamber via a non-heated third volume.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIGS. 1A-B depict a gas delivery system in accordance with some embodiments of the present invention.

FIGS. 2A-B depict alternative apparatus for holding and vaporizing a precursor in accordance with some embodiments of the present invention.

Figure 1A:
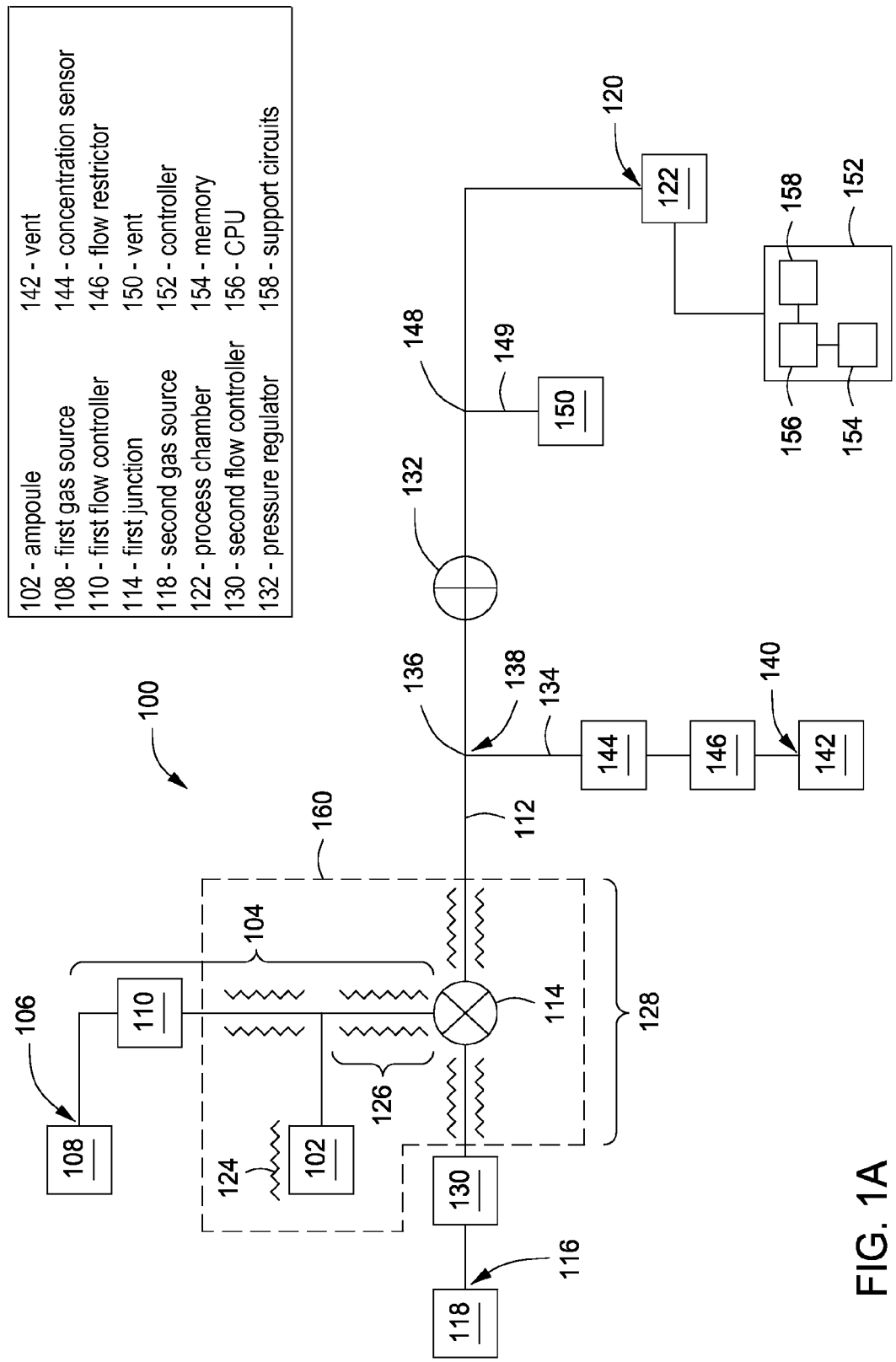

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for gas delivery are disclosed herein. Methods and apparatus of the present invention advantageously provide vaporization of low vapor pressure precursors in solid or liquid form at high efficiency and delivery accuracy while reducing energy input costs and improving delivery rate. For example, embodiments of the inventive gas delivery system may require heating of only a portion of the conduits carrying the vaporized precursor. Further, some embodiments of the inventive gas delivery system advantageously allow for flow control devices, such as mass flow controllers or the like, to be disposed downstream of the vaporized precursor due to limited possibility of condensation of the precursor during delivery. Other and further embodiments and advantages of the inventive methods and apparatus are discussed below.

FIGS. 1A-B depict a gas delivery system 100 in accordance with at least some embodiments of the present invention. The gas delivery system 100 may include an ampoule 102 for storing a precursor in solid or liquid form. For example, the precursor may be any suitable low vapor pressure precursor used in processes, such as deposition processes or the like. Exemplarily precursors may include dichlorosilane (DCS), trichlorosilane (TCS), carbon tetrachloride (CCl4), or the like. A first conduit 104 may be coupled to the ampoule 102. The first conduit 102 may include a first end 106 coupled to a first gas source 108. The first gas source 108 is disposed upstream of the ampoule 102 as illustrated in FIG. 1A. The first conduit 104 may be used to draw a vapor of the precursor from the ampoule into the first conduit 104.

For example, as illustrated in FIGS. 2A-B, various embodiments of the first conduit 104 are possible. For example, when using a liquid form of the precursor, the first conduit 104 may be coupled to the ampoule 102 such that the first conduit enters the volume of the ampoule 102 and has an end 202 disposed beneath the surface of the liquid precursor such that the first gas may bubble through the precursor to carry vapor and/or small droplets of the precursor within the gas stream. A second end 204 may be disposed above the liquid precursor to receive a concentrated precursor gas mixture of the first gas and precursor (end 204) as illustrated in FIG. 2A. Alternatively, the first end 202 may be disposed above the surface of the liquid precursor.

Alternatively, in some embodiments, the first conduit 104 may be coupled to the ampoule 102 such that a sublimed precursor from a solid form of the precursor may be drawn through an opening in the ampoule 102 to enter the first conduit 104, as illustrated in FIG. 2B. The sublimed precursor may mix with the first gas flowing through the first conduit 104 to form a concentrated precursor gas mixture from the first gas and the sublimed precursor.

Returning to FIG. 1A, the flow of the first gas may be controlled by a first flow controller 110. The first flow controller may be coupled to the first conduit 104 between the first end 106 of the first conduit 104 and the ampoule 102. The first flow controller 110 may be a mass flow controller or the like.

A second conduit 112 may be coupled to the first conduit 104 at a first junction 114 located downstream of the ampoule 102. As used herein, the term "junction" may include the intersection of multiple flow paths or sections of conduit, such as by a T-shaped joint or section of conduit, a selective valve such as a valve which allows for the selection of either a first or second path, or the like. The second conduit 112 may have a first end 116 coupled to a second gas source 118. The second conduit 112 may have a second end 120 coupled to a process chamber 122. The second gas source 118 may provide a second gas to dilute the concentrated precursor gas mixture entering the second conduit 112 at the first junction 114.

In some embodiments, heat may be required over portions of the gas delivery system 100 to vaporize the precursor and/or to maintain the precursor in a vaporized state. For example, a heating source 124 may be configured to heat the ampoule 102 and at least a first portion 126 of the first conduit 104 from the ampoule 102 to the first junction 114 at the second conduit 112. The heating source 124 may be any suitable heating source, such as heating tape, forced air heated cabinet, heat exchanger, or the like. Further, and optionally, as illustrated in FIG. 1A, the heating source 124 may heat the entirety of the first conduit 104 up to the first flow controller 110, or the entirety of the first conduit up to the first gas source 108 (not shown). In some embodiments, the first conduit 104 may be heated up to the first gas source 108. In such embodiments, the flow controller should be configured for operation in a heated environment. In some embodiments, a contained heated environment 160 may be provided to facilitate efficient heating of the system. For example, in some embodiments, the contained heated environment may include an enclosure to contain or surround the heated components and portions of the conduit. Such embodiments may facilitate more uniform heating as well as efficiency. However, use of an enclosure may cause the system to take longer to stabilize. In some embodiments, the contained heated environment 160 may include a heat exchanger style heat bath having the portions of the system to be heated disposed therein. The high thermal mass and thermal arrest provided by the heat bath may help reduce the possibility of catastrophic overheating that could lead to decomposition of the precursor.

The heating source 124 may be configured to heat only a second portion 128 of the second conduit 112, where the second portion 128 includes the first junction 114. The second portion 128 may extend on both sides of the first junction 114 as illustrated in FIG. 1A, or may extend only downstream of the first junction 114 (not shown). The second portion 128 of the second conduit 112 may include the portion where the concentrated precursor gas mixture received from the first conduit 104 mixes with the second gas to form a diluted precursor gas mixture. As discussed above, heating of the concentrated precursor gas mixture may be required to prevent the precursor from condensing out of the concentrated precursor gas mixture. However, once the partial pressure of the precursor is below the vapor pressure of the precursor at room temperature, e.g., about 25 degrees Celsius, then the likelihood of condensation of the precursor may be limited. For example, by mixing the second gas with the concentrated precursor gas mixture, such a condition for the partial pressure of the precursor can be achieved in the newly formed diluted precursor gas mixture in the second portion 128 of the second conduit 112. Accordingly, the partial pressure of the precursor in the diluted precursor gas mixture may be less than the vapor pressure of the precursor at room temperature. Thus, the remainder of the second conduit 112, i.e., the portion of the second conduit 112 downstream of the second portion 128, may require less heating or may require no heating because condensation of the precursor from the diluted precursor gas mixture may be less likely.

The second conduit 112 may include a second flow controller 130 coupled to the second conduit 112. In some embodiments, for example as illustrated in FIG. 1A, the second flow controller 130 is disposed between the first end 116 of the second conduit 112 and the first junction 114, or upstream of the first junction 114. For example, in the embodiment illustrated in FIG. 1A, the second flow controller 130 provides the second gas at a desired flow rate to mix with the concentrated precursor gas mixture in the second portion 128 of the second conduit 112.

Further, in some embodiments, such as shown in FIG. 1A, the second conduit 112 may include a pressure regulator 132 disposed in the second conduit 112 between the first junction 114 and the second end 120 of the second conduit 112 to regulate the pressure in the second conduit 112 between the pressure regulator 132 and the second flow controller 130, e.g., upstream of the pressure regulator 132. In some embodiments, the pressure in the second conduit 112 using the embodiments shown in FIG. 1A may be about 200 Torr. For example, the pressure regulator 132 may be necessary to prevent pressure fluctuations in the second conduit 112 that could occur if the second conduit 112 were to be directly exposed to the pressure of the process chamber 122. For example, the pressure in the process chamber 122 may change frequently due to various processes being performed that may introduce process gases in the process chamber 122 or require the pressure in the process chamber 122 to be changed. The presence of the pressure regulator 132 may stabilize the pressure in the second conduit 112 which, for example, may result in consistent and reproducible precursor loading in diluted precursor gas mixture that may be flowed to the process chamber 122.

Alternatively, the second flow controller 130 and the pressure regulator 132 may be configured as illustrated in FIG. 1B. For example, as illustrated in FIG. 1B, the second flow controller 130 may be disposed between the first junction 114 and the second end of the second conduit 120, or downstream of the first junction 114. For example, in the embodiments illustrated in FIG. 1B, the second flow controller 130 may provide a desired flow rate of the diluted precursor gas mixture to the process chamber 122. The downstream position of the second flow controller 130 as shown in FIG. 1B may be enabled by the methods and apparatus of the present invention. For example, flow controllers, such as mass flow controllers, are not typically used downstream of precursor gas mixtures because condensation of the precursor gas mixture may occur resulting in inaccuracy of the delivery of the gas mixture to the process chamber or damage to the flow controller. However, as discussed herein, the methods and apparatus of the present invention reduce or eliminate the possibility of condensation of the precursor in the diluted precursor gas mixture, thus enabling the downstream positioning of the flow controller without the attendant risk of condensation forming in the flow controller.

As illustrated in FIG. 1B, and also alternative to FIG. 1A, the pressure regulator may be disposed between the first end 116 of the second conduit 112 and the first junction 114 to regulate the pressure in the second conduit 112 between the regulator 132 and the second flow controller 130. In some embodiments, the pressure in the second conduit 112 may be higher than in the embodiments of FIG. 1A, for example, at least about 500 Torr. The pressure in the second conduit 112 may be higher in the embodiments of FIG. 1B to provide a sufficient upstream pressure to the second flow controller 130 for accurate operation. In some embodiments, sufficient upstream pressure in the second conduit 112 to operate the second flow controller may be at least about 500 Torr.

In some embodiments, the gas delivery system 100 may include a real-time monitoring device downstream of the second portion 128 of the second conduit 112. The real-time monitoring device may be disposed in-line or along a sample line, for example, such as a third conduit 134 as discussed below. The real-time monitoring device may be enabled by the methods and apparatus of the present invention. For example, the low concentration of the precursor in the diluted precursor gas mixture and the absence of heating in the second conduit 112 outside of the second portion 128 may enable real-time monitoring devices in the gas delivery system 100.

The third conduit 134 may be coupled to the second conduit between the first junction 114 and the pressure regulator 132 (as shown in FIG. 1A) or between the first junction 114 and the second flow controller 130 at a second junction 136 (as shown in FIG. 1B). The third conduit 134 may have a first end 138 coupled to the second junction 136 and a second end 140 coupled to a vent 142. The vent 142 may be an exhaust line or the like, for example, coupled to an abatement system or the like.

The real-time monitoring device may be a concentration sensor 144 coupled to the third conduit 134. The concentration sensor may be any suitable sensor for determining concentration, such as one of the Piezocon® line, available from Lorex Industries, Inc. of Poughkeepsie, N.Y. The concentration sensor 144 may determine the concentration of the precursor in the diluted precursor gas mixture flowing to the process chamber 122 via the second conduit 112. A flow restrictor 146 may be disposed in the third conduit 134 between the concentration sensor 144 and the vent 142 to, for example, limit flow of the diluted precursor gas mixture to the third conduit 134 at the second junction 136, such that a substantial portion of the diluted precursor gas mixture flows towards the process chamber 122. Since the concentration after mixing is very low and the sampling line flow is limited, vapor wasted by sampling is limited. Also, since the concentration sensor 144 is off-line, any condensation problems that do occur will cause little or no problems. Also, any maintenance services performed on the concentration sensor 144 will have minimum impact on the main operation of the gas delivery system 100.

The gas delivery system 100 may include a third junction 148 proximate the second end 120 of the second conduit 112. The fourth conduit 149 has a first end coupled to the third junction 148 and a second end coupled to a vent 150. In some embodiments, the vent 142 and the vent 150 may be the same exhaust line, or may be coupled to the same exhaust line. Similarly, the vent 150 may be coupled to an abatement system or the like. The third junction 148 may include a valve (not shown) for selecting between flow to the process chamber 122 and flow to the fourth conduit 149 (and vent 150). For example, this type of selective flow may be used during processing in the process chamber 122 such that the precursor is continuously vaporized over the time period of processing in the process chamber 122 to limit variations, such as in concentration in the diluted precursor gas mixture or the like that may otherwise result from starting and stopping the flow of the first gas or the like.

A controller 152 may be coupled to the process chamber 122 and/or support systems, such as the gas delivery system 100, directly (as shown in FIG. 1A) or, alternatively, via computers (or controllers) associated with the process chamber and/or the support systems. The controller 152 may be one of any form of general-purpose computer processor that can be used in an industrial setting for controlling various chambers and sub-processors. The memory, or computer-readable medium, 154 of the CPU 156 may be one or more of readily available memory such as random access memory (RAM), read only memory (ROM), floppy disk, hard disk, or any other form of digital storage, local or remote. The memory 154 may store routines to be performed by the process chamber 122 and/or various support systems, such as the gas delivery system 100. Exemplary routines may include a method 300 for delivering the precursor to the process chamber 122 as described below. Support circuits 158 are coupled to the CPU 156 for supporting the processor in a conventional manner. These circuits include cache, power supplies, clock circuits, input/output circuitry and subsystems, and the like.

Figure 3:
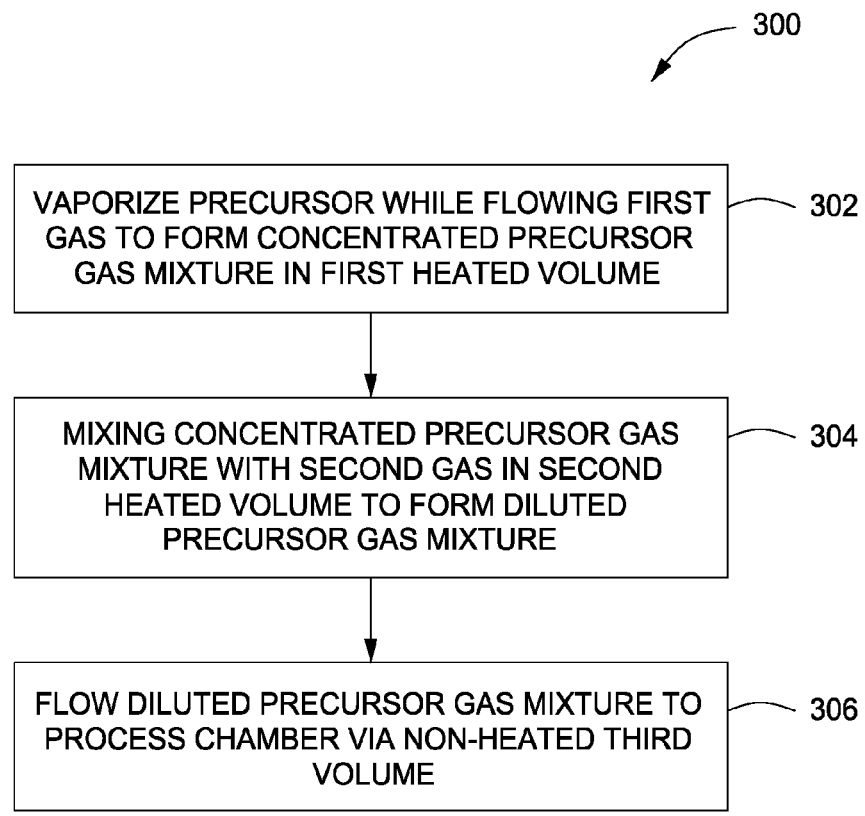
FIG. 3 depicts a flow chart for a method of delivering a precursor in accordance with some embodiments of the present invention.

FIG. 3 depicts a flow chart for the method 300 of delivering a precursor to a process chamber, such as the process chamber 122. The method 300 is described below with respect to FIGS. 1A-B and 2A-B. The method 300 begins at 302 by vaporizing the precursor while flowing the first gas to form the concentrated precursor gas mixture in a first heating volume. The first heating volume may include the first conduit 104 and the ampoule 102. The first gas, as discussed above, may be provided by the first gas source 108. The first gas may include a carrier gas, such as an inert gas. In some embodiments, the first gas may be one or more of nitrogen ($N_2$), hydrogen ($H_2$), argon (Ar), helium (He), or the like. The flow of the first gas may be controlled by the first flow controller 110. As discussed below, the flow of the first gas may be adjusted in response to sampling the concentration of the precursor in the diluted precursor gas mixture formed downstream of the concentrated precursor gas mixture formed in the first heating volume at 302.

The precursor may be vaporized by alternative methods. For example, as discussed above, the precursor may be in liquid form. Accordingly, in some embodiments, such as illustrated in FIG. 2A, the first gas may be flowed into a portion (e.g., the ampoule 102) of the first heated volume holding the precursor. The first gas may be bubbled into the liquid precursor to form the concentrated precursor gas mixture. Alternatively, as discussed above, the precursor may be in solid form. Accordingly, in some embodiments, such as illustrated in FIG. 2B, the solid precursor may be sublimed and enter the first conduit 104 where the sublimed precursor mixes with the flowing first gas to form the concentrated precursor gas mixture.

At 304, the concentrated precursor gas mixture may be mixed with the second gas in a second heated volume (e.g., the second portion 128) to form the diluted precursor gas mixture. As discussed above, the second gas may be provided by the second gas source 118. The second gas may be the same as the first gas. In some embodiments, the second gas may be one or more of nitrogen (N2), hydrogen (H2), argon (Ar), helium (He), or the like. The second gas may be different from the first one. However, providing a different second gas introduces more complexity, making downstream concentration monitoring more difficult since it will be a mixture of three components rather than a mixture of two components.

The second gas may be flowed at a higher flow rate than the first gas. For example, the flow rate of the second gas may be about 5 or more times the flow rate of the first gas. The higher flow rate of the second gas may be enabled by the present invention. Typically, a single conduit is provided to an ampoule for delivering the precursor, thereby limiting the maximum flow rate of the carrier gas due to the risk of splashing or entraining particles in the gas stream. To the contrary, however, the gas delivery system 100 of the present invention provides a second gas along the second conduit 112 which does not flow through the ampoule 102. Accordingly, events that may necessitate reducing a flow rate, such as splashing of the precursor in the ampoule 102 or the like, may be avoided in the gas delivery system 100. Thus, the flow rate of the second gas in the second conduit 112 (and thus the total flow rate of the gas delivery system) may be higher than in conventional gas delivery systems. The higher flow rate of the second gas may advantageously improve response time in the gas delivery system by up to about 100 times over a conventional gas delivery system.

At 306, the diluted precursor gas mixture may be flowed to the process chamber 122 via a non-heated third volume, e.g., the remaining portion of the second conduit 112, downstream of the second portion 128. As discussed above, the diluted precursor gas mixture formed in the second heated volume may have a partial pressure of the precursor that is less than the vapor pressure of the precursor at room temperature, e.g., about 25 degrees Celsius. Accordingly, the diluted precursor gas mixture may require no additional heating in the non-heated third volume because condensation of the precursor is less likely.

The pressure of the diluted precursor gas mixture may be regulated in the second heated volume and the non-heated third volume. For example, the pressure of the diluted precursor gas mixture may be regulated downstream of the second flow controller 130 used to controller the flow of the second gas from the second gas source 118 as illustrated in FIG. 1A. Alternatively, the pressure of the diluted precursor gas mixture may be regulated upstream of the second flow controller 130, where the second flow controller may be used to control the flow of the diluted precursor gas mixture to the process chamber 122 and downstream of the second gas source 118 use to provide the second gas to the second volume as illustrated in FIG. 1B.

The diluted precursor gas mixture may be flowed to the process chamber 122 selectively. For example, the diluted precursor gas mixture may be selectively flowed to the process chamber 122 or to the vent 150. For example, the flow to the process chamber 122 and the vent 150 may be alternated according to the process being performed in the process chamber 122, such as a deposition process, a cyclical deposition process, or the like.

In some embodiments, the method 300 may include sampling a portion of the diluted precursor gas mixture from the third volume, for example, using the sample line (e.g., the third conduit 134). Sampling of the portion of the diluted precursor gas mixture may occur at a first flow rate that is slower than a second flow rate of a second portion of the diluted precursor gas mixture that is flowing to the process chamber 122. For example, the flow restrictor 146 may facilitate the disparity between the first and second flow rates to ensure that a substantial portion of the diluted precursor gas mixture flows to the process chamber 122. A concentration of the precursor in the diluted precursor gas mixture may be determined, for example, using the concentration sensor 144 as discussed above.

If the determined concentration of the precursor in the diluted precursor gas mixture is not within a desired tolerance level, parameters of the gas delivery system that may control the concentration of the precursor may be adjusted. For example, at least one of heating temperature of the first or second heated volumes, flow rate of the first gas, flow rate of the second gas, or pressure in the second heated volume and third non-heated volume may be adjusted until the desired tolerance level is reached. In some embodiments, the first gas flow may be increased such that the amount of precursor in the final mixture will increase. Control of the flow rate of the first gas or the second gas may provide a faster response time than controlling the heating temperature. For example, the maximum flow possible will be limited by the type of precursor and the temperature. There are no special requirements for the flow rate of the second gas other than providing enough dilution. For gas delivery over long lines, a total flow rate as high as 5 slm might be desirable. However, the specific temperatures and flow rates will depend upon the specific configuration of the system and the precursors being used.

Thus, methods and apparatus for gas delivery have been disclosed herein. Methods and apparatus of the present invention advantageously provides vaporization of a low vapor pressure precursor in solid or liquid form at high efficiency and delivery accuracy while reducing energy input costs and improving delivery rate.

While the foregoing is directed to embodiments of the present invention, other and further embodiments of the invention may be devised without departing from the basic scope thereof.

The invention claimed is:

1. A method of delivering a precursor to a process chamber, comprising:
vaporizing a precursor while flowing a first gas to form a concentrated precursor gas mixture in a first heated volume;
mixing the concentrated precursor gas mixture with a second gas in a second heated volume to form a diluted precursor gas mixture, wherein the partial pressure of the precursor in the diluted precursor gas mixture is less than the vapor pressure of the precursor at about 25 degrees Celsius; and
flowing the diluted precursor gas mixture to a process chamber via a non-heated third volume.

2. The method of claim 1, further comprising:
regulating the pressure of the diluted precursor gas mixture in the second heated volume and the third volume downstream of a second flow controller used to control the flow of the second gas from a second gas source.

3. The method of claim 1, further comprising:
regulating the pressure of the diluted precursor gas mixture in the second heated volume and the third volume upstream of a second flow controller used to control the flow of the diluted precursor gas mixture to the process chamber and downstream of a second gas source used to provide the second gas to the second volume.

4. The method of claim 1, further comprising:
controlling the flow of the first gas upstream of the first heated volume using a first flow controller disposed between a first gas source which provides the first gas and the first heated volume.

5. The method of claim 4, wherein vaporizing the precursor further comprises:
   flowing the first gas into a portion of the first heated volume holding the precursor; and
   bubbling the first gas into the liquid state of the precursor to form the concentrated precursor gas mixture.

6. The method of claim 4, wherein vaporizing the precursor further comprises:
   subliming the precursor; and
   mixing the sublimed precursor with the flowing first gas to form the concentrated precursor gas mixture.

7. The method of claim 1, wherein flowing the diluted precursor gas mixture to the process chamber further comprises:
   selectively flowing the diluted precursor gas mixture to the process chamber or to a vent during a chamber process.

8. The method of claim 7, wherein selectively flowing the diluted precursor gas mixture to the process chamber or to the vent during the chamber process further comprises:
   maintaining a continuous flow of the diluted precursor gas mixture while alternating the flow of the diluted precursor gas mixture between the process chamber and the vent.

9. The method of claim 1, further comprising:
   sampling a portion of the diluted precursor gas mixture from the third volume; and
   determining a concentration of the precursor in the diluted precursor gas mixture.

10. The method of claim 9, wherein sampling the portion of the diluted precursor gas mixture further comprises:
    sampling the portion of the diluted precursor gas mixture at a first flow rate that is slower than a second flow rate of a second portion of the diluted precursor gas mixture that is flowing to the process chamber.

11. The method of claim 9, further comprising:
    adjusting at least one of heating temperature of the first or second heated volumes, flow rate of the first gas, or flow rate of the second gas if the determined concentration of the precursor in the diluted precursor gas mixture is not within a desired tolerance level.

12. The method of claim 11, further comprising
    adjusting the pressure in the second heated volume and the non-heated third volume if the determined concentration of the precursor in the diluted precursor gas mixture is not within a desired tolerance level.

13. The method of claim 1, wherein mixing the concentrated precursor gas mixture further comprises:
    flowing the second gas at a flow rate of about five or more times the flow rate of the first gas.

14. A method of delivering a precursor to a process chamber, comprising:
    vaporizing a precursor or sublimating a solid precursor disposed within an ampoule while flowing a first gas from a first gas source through a first flow controller to form a concentrated precursor gas mixture in a first heated volume within the ampoule;
    mixing the concentrated precursor gas mixture with a second gas from a second gas source connected to a second flow controller to form a diluted precursor gas mixture in a second heated volume outside of the ampoule, wherein the partial pressure of the precursor in the diluted precursor has mixture is less than the vapor pressure of the precursor at about 25 degrees Celsius; and
    flowing the diluted precursor gas mixture from the second heated volume to a process chamber via a non-heated third volume.

15. The method of claim 14, further comprising:
    determining the concentration of the precursor in the diluted precursor gas mixture using a concentration sensor coupled to the non-heated third volume.

16. The method of claim 15, further comprising:
    restricting the flow of the diluted precursor gas mixture to the third conduit with a flow restrictor disposed between the concentration sensor and a vent to selectively direct the diluted precursor gas mixture to an exhaust system.

* * * * *